(12) United States Patent
Mao et al.

(10) Patent No.: US 10,028,416 B2
(45) Date of Patent: Jul. 17, 2018

(54) HEAT DISSIPATING SYSTEM FOR DATA CENTER

(71) Applicant: CLOUD NETWORK TECHNOLOGY SINGAPORE PTE LTD., Rubyland Complex Singapore (SG)

(72) Inventors: Tze-Chern Mao, New Taipei (TW); Chih-Hung Chang, New Taipei (TW); Yen-Chun Fu, New Taipei (TW); Yao-Ting Chang, New Taipei (TW); Chao-Ke Wei, New Taipei (TW); Hung-Chou Chan, New Taipei (TW)

(73) Assignee: Cloud Network Technology Singapore Pte. Ltd., Singapore (SG)

( * ) Notice: Subject to any disclaimer, the term of this patent is extended or adjusted under 35 U.S.C. 154(b) by 168 days.

(21) Appl. No.: 14/946,239

(22) Filed: Nov. 19, 2015

(65) Prior Publication Data

US 2017/0127571 A1 May 4, 2017

(30) Foreign Application Priority Data

Oct. 28, 2015 (CN) .......................... 2015 1 0708313

(51) Int. Cl.
*H05K 5/00* (2006.01)
*H05K 7/20* (2006.01)

(52) U.S. Cl.
CPC .................. *H05K 7/20736* (2013.01)

(58) Field of Classification Search
CPC ............. H05K 7/1485; H05K 7/20709; H05K 7/20736; H05K 7/20745
See application file for complete search history.

(56) References Cited

U.S. PATENT DOCUMENTS

| | | | |
|---|---|---|---|
| 6,574,104 B2 * | 6/2003 | Patel | H05K 7/20745 165/104.33 |
| 8,721,409 B1 * | 5/2014 | Morales | H05K 7/20209 454/184 |
| 8,941,256 B1 * | 1/2015 | Czamara | F03D 9/00 290/55 |
| 9,188,356 B2 * | 11/2015 | Murayama | F24F 11/0001 |
| 9,237,680 B2 * | 1/2016 | Murayama | H05K 7/20745 |
| 9,635,786 B2 * | 4/2017 | Leckelt | H05K 7/20745 |
| 2010/0130117 A1 * | 5/2010 | Larsen | F24F 11/0001 454/184 |
| 2010/0154448 A1 * | 6/2010 | Hay | G06F 1/20 62/175 |
| 2010/0252233 A1 * | 10/2010 | Absalom | H05K 7/20745 165/57 |

(Continued)

*Primary Examiner* — Steven B McAllister
*Assistant Examiner* — Jonathan Cotov
(74) *Attorney, Agent, or Firm* — ScienBiziP, P.C.

(57) ABSTRACT

A heat dissipating system for a data center includes a data center and an air processing unit. The data center includes an enclosure and an electronic device, and defines a first air vent and a second air vent. The air processing unit includes a case and an air processing device. The case defines a first air inlet, a second air inlet, and a first air outlet. At least one air inlet damper is mounted on the case, and a first return air damper is mounted in the case. The data center can adjust cooling based on ambient temperature through the air inlet damper and the first return air damper.

18 Claims, 11 Drawing Sheets

(56) References Cited

U.S. PATENT DOCUMENTS

| | | | |
|---|---|---|---|
| 2011/0300789 A1* | 12/2011 | Kinoshita | F24F 11/0001 454/184 |
| 2012/0167610 A1* | 7/2012 | Dunnavant | F28C 1/14 62/314 |
| 2012/0168119 A1* | 7/2012 | Dunnavant | F24F 3/14 165/59 |
| 2012/0234527 A1* | 9/2012 | Murayama | G05D 22/02 165/287 |
| 2012/0298334 A1* | 11/2012 | Madaffari | H05K 7/20745 165/104.13 |
| 2013/0174597 A1* | 7/2013 | Cader | F24F 13/04 62/324.1 |
| 2014/0170951 A1* | 6/2014 | Ryu | H05K 7/20745 454/184 |
| 2014/0340842 A1* | 11/2014 | Towner | F24F 6/02 361/679.48 |
| 2014/0349563 A1* | 11/2014 | Honda | F24F 1/0007 454/184 |
| 2016/0192543 A1* | 6/2016 | Matsuda | H05K 7/20736 165/246 |

\* cited by examiner

HEAT DISSIPATING SYSTEM FOR DATA CENTER

FIELD

The subject matter herein generally relates to a heat dissipating system, and particularly relates to a heat dissipating system for a data center.

BACKGROUND

In order to allow certain electronics to function properly, a data center may need to adjust cooling based on ambient temperature. Data centers can use cold air from outside to dissipate heat.

BRIEF DESCRIPTION OF THE DRAWINGS

Implementations of the present technology will now be described, by way of example only, with reference to the attached figures.

DETAILED DESCRIPTION

Figure 1:
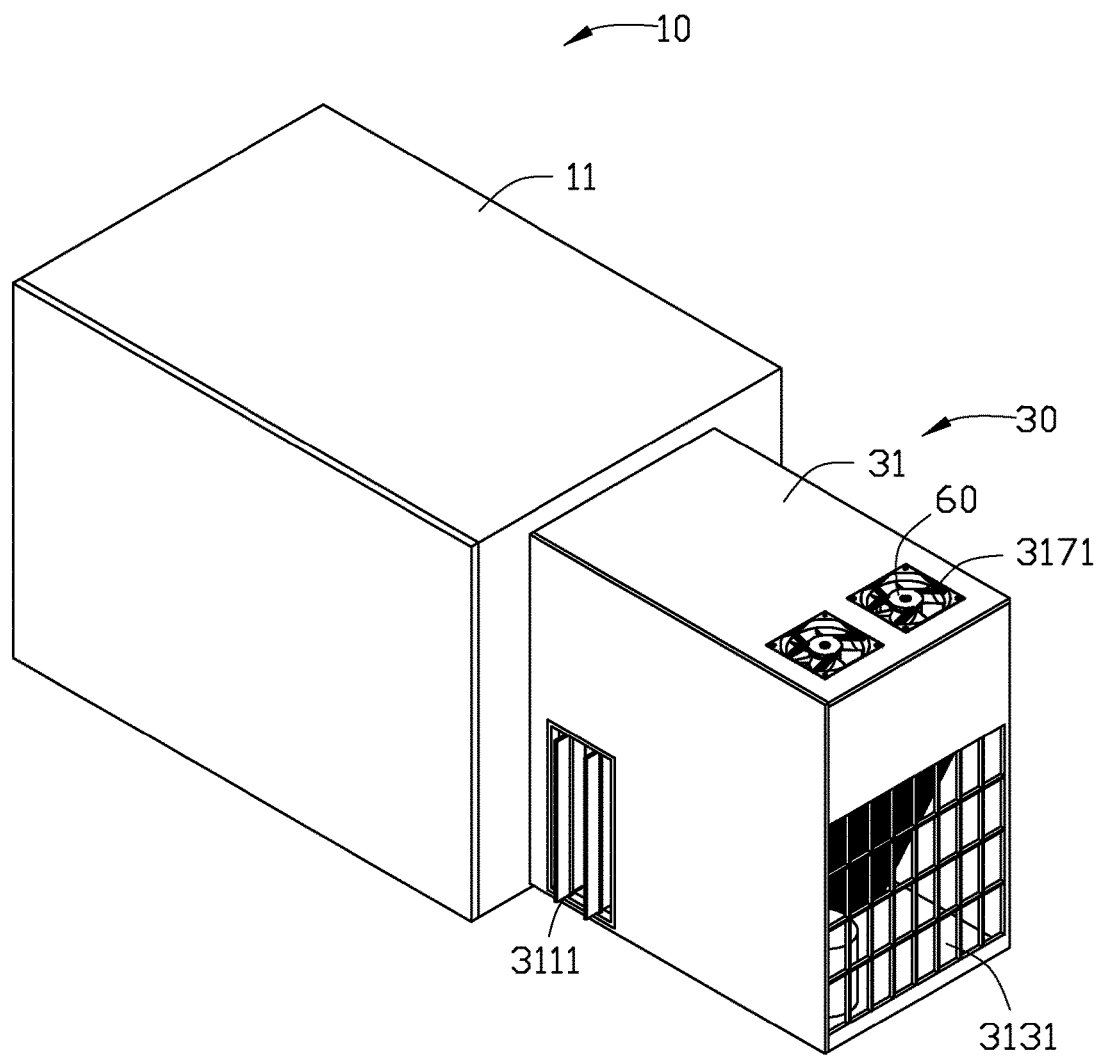
FIG. 1 is an assembled, isometric view of a first embodiment of a heat dissipating system for a data center, wherein the data center comprises a data center and an air processing unit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure relates to a heat dissipating system for a data center.

FIG. 1 illustrates a first exemplary embodiment of a heat dissipating system for a data center. The heat dissipating system comprises a data center 10 and an air processing unit 30. The air processing unit 30 is configured to dissipate heat from the data center 10.

Figure 2:
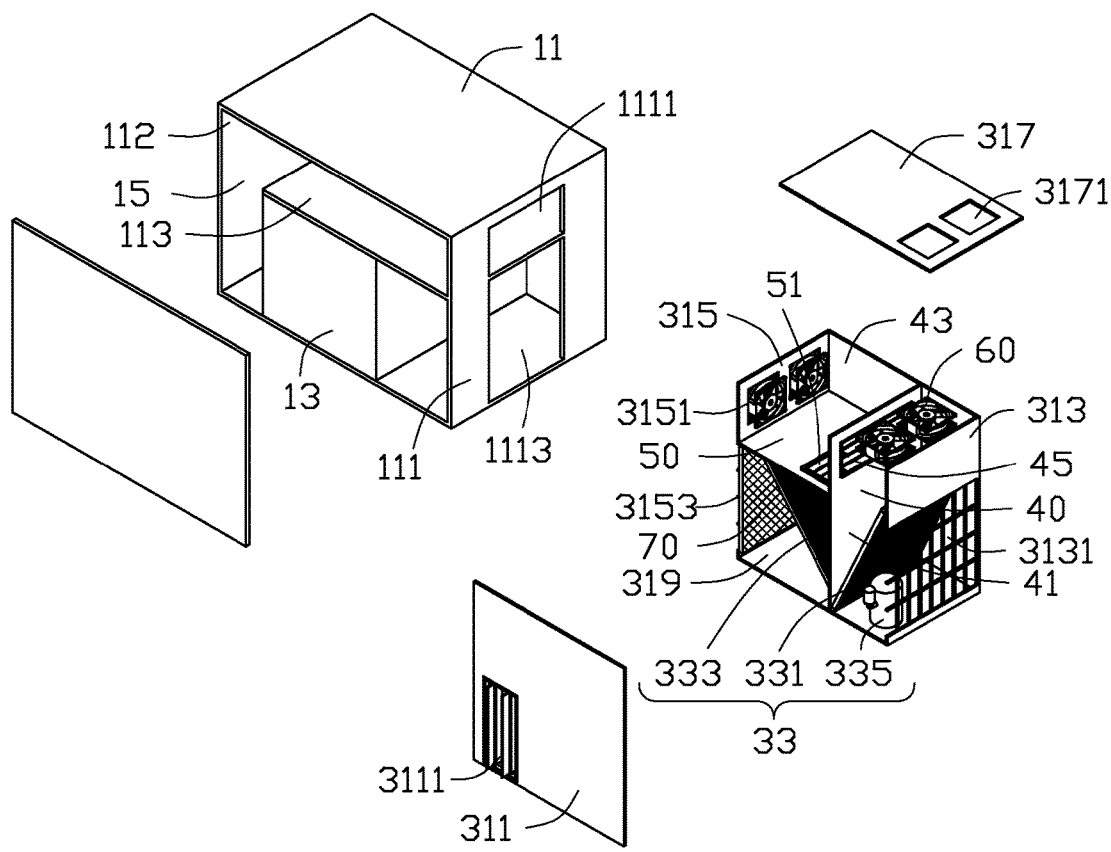
FIG. 2 is an exploded, isometric view of the heat dissipating system for a data center of FIG. 1.

FIG. 2 illustrates that the data center 10 comprises an enclosure 11 and an electronic device 13 mounted in the enclosure 11. The enclosure 11 comprises a front plate 111, a rear plate 112 and a separating member 113 vertically extending in from a middle portion of the front plate 111. The front plate 111 defines a first air vent 1111 above the separating member 113, and the front plate 111 defines a second air vent 1113 under the separating member 113. An extremity of the separating member 113 and the rear plate 112 cooperatively define a channel 15. The electronic device 13 is located under the separating member 113.

The air processing unit 30 comprises a case 31 (shown in FIG. 1) and an air processing device 33 mounted in the case 31.

The case 31 comprises two opposite side walls 311, a front wall 313 coupled between front ends of the two side walls 311, a rear wall 315 coupled between rear ends of the two side walls 311, a top wall 317 coupled between top ends of the two side walls 311, and a bottom wall 319 coupled between bottom ends of the two side walls 311. A first separating plate 40 is coupled between the top wall 317 and the bottom wall 319 and is parallel to the front wall 313. The case 31 is divided into a first chamber 41 and a second chamber 43 by the first separating plate 40. A second separating plate 50 is mounted in an upper portion of the second chamber 43. The second separating plate 50 is coupled between the first separating plate 40 and the rear wall 315 and is parallel to the top wall 317. An air inlet damper 3111 is mounted on a rear end of each of the side walls 311. In one embodiment, the air inlet dampers 3111 are opposite to each other.

The front wall 313 defines an air inlet 3131. The rear wall 315 defines two first air outlets 3151 located above the second separating plate 50, and a second air inlet 3153 is defined in the rear wall 315 below the second separating plate 50. The first air outlets 3151 are opposite to the first air vent 1111 of the data center 10, and the second air inlet 3153 is opposite to the second air vent 1113 of the data center 10. The top wall 317 is located at the first chamber 41, and two second air outlets 3171 are defined in the top wall 317. An air outlet damper 45 is mounted on the first separating plate 40 and is located above the second separating plate 50, and a return air damper 51 is mounted on the second separating plate 50 adjacent to the first separating plate 40. Fans 60 are mounted on the first air outlet 3151 and the second air outlet 3171, and a filter screen 70 is mounted on the second air inlet 3153.

The air processing device 33 comprises a condenser 331, an evaporator 333 coupled to the condenser 331, and a compressor 335 coupled to the condenser 331 and the evaporator 333. The condenser 331 is sloping and forms at a substantially acute angle to the bottom wall 319. The evaporator 333 is sloping and forms a substantially acute angle to the bottom wall 319. The condenser 331 and the compressor 335 are mounted in the first chamber 41, and the condenser 331 is located between a bottom end of the first separating plate 40 and a middle portion of the front wall 313. The evaporator 333 is mounted in the second chamber 43, and located between the bottom end of the first separating plate 40 and a middle portion of the second separating plate 50. In one embodiment, the condenser 331 and the evaporator 333 substantially form V-shaped.

Figure 3:
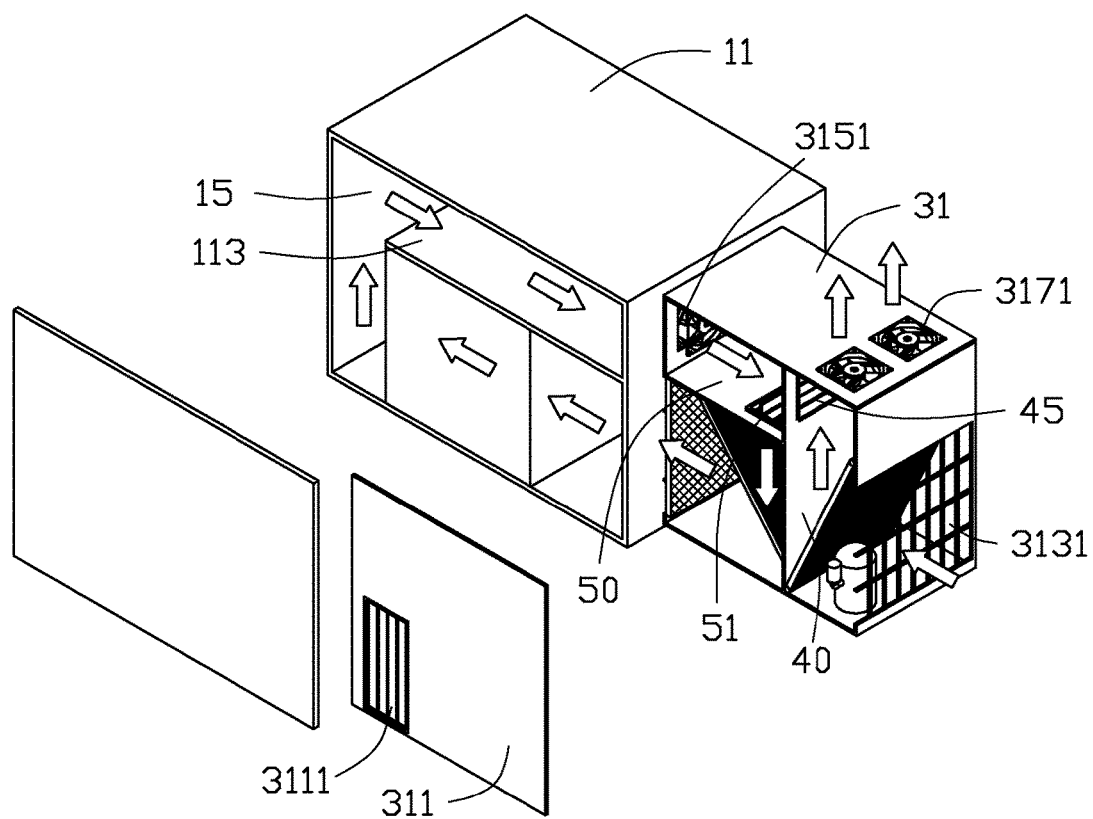
FIG. 3 is a diagrammatic first airflow direction view of the first embodiment of a heat dissipating system for a data center.

FIG. 3 illustrates a first airflow direction of the first embodiment of a heat dissipating system for a data center. When ambient temperature is not suitable to dissipate heat for the data center 10 by inputting cold air from outside, the air inlet damper 3111 and the air outlet damper 45 are closed, and the return air damper 51 is open. The second chamber 43, the second air inlet 3153 and the second air vent 1113 cooperatively define a first air channel. Air enters into the first chamber 41 through the first air inlet 3131 of the air processing unit 30, and the condenser 331 receives hot air output through the second air outlet 3171 and the fans 60. Hot air generated by the electronic device 13 enters above the second separating plate 50 of the second chamber 43 successively through the channel 15, above the separating member 113, the first air vent 1111, and the fans 60. Then, the hot air generated by the electronic device 13 enters below the second separating plate 50 of the second chamber 43 and is cooled by the evaporator 333. The cold air cooled by the evaporator 333 enters into the data center 10 through the filter screen 70, the second air inlet 3153 and the second air vent 1113, and dissipates heat for the electronic device 13.

Figure 4:
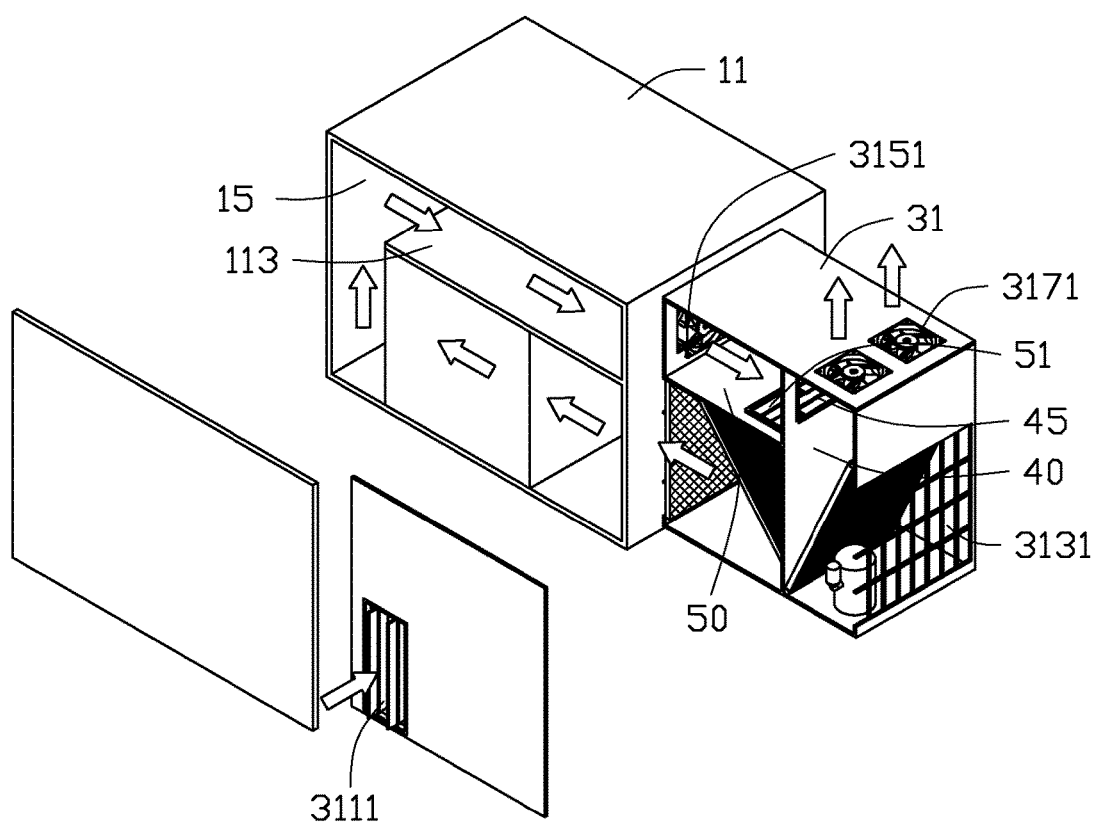
FIG. 4 is a diagrammatic second airflow direction view of the first embodiment of a heat dissipating system for a data center.

FIG. 4 illustrates a second airflow direction of the first embodiment of a heat dissipating system for a data center. When ambient temperature is high, heat from the data center 10 is dissipated by inputting cold air from outside, the air inlet damper 3111 and the air outlet damper 45 are open, and the return air damper 51 is closed. The air inlet damper 3111, the second air inlet 3153 and the second air vent 1113 cooperatively define a second air channel. Cold air from outside enters into the second chamber 43 through the air inlet dampers 3111, and enters into the data center 10 through the filter screen 70, the second air inlet 3153 and the second air vent 1113 to dissipate heat from the electronic device 13. Hot air generated by the electronic device 13 enters above the second separating plate 50 of the second chamber 43 successively through the channel 15, above the separating member 113, the first air vent 1111, and the fans 60. The hot air enters into the first chamber 41 through the air outlet damper 45, and is output through the second air outlet 3171 and the fans 60.

Figure 5:
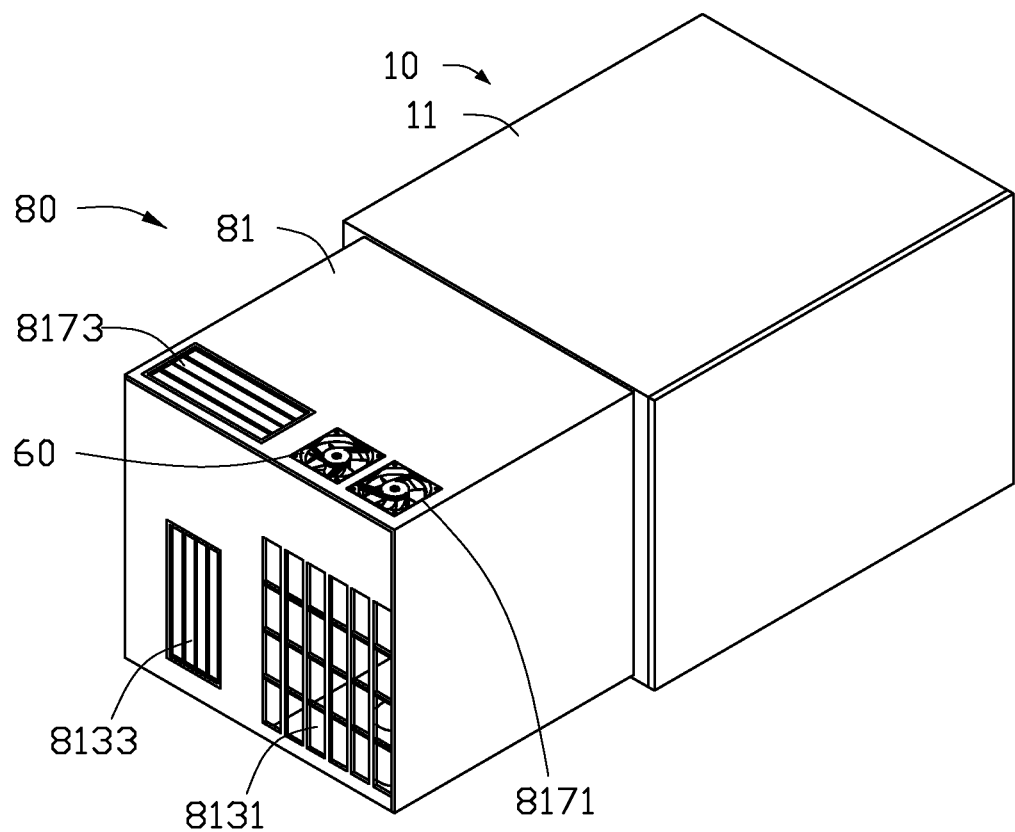
FIG. 5 is an assembled, isometric view of a second embodiment of a heat dissipating system for a data center, wherein the data center comprises a data center and an air processing unit.

FIG. 5 illustrates a second exemplary embodiment of a heat dissipating system for a data center. The heat dissipating system comprises a data center 10 and an air processing unit 80. The air processing unit 80 is configured to dissipate heat from the data center 10.

Figure 6:
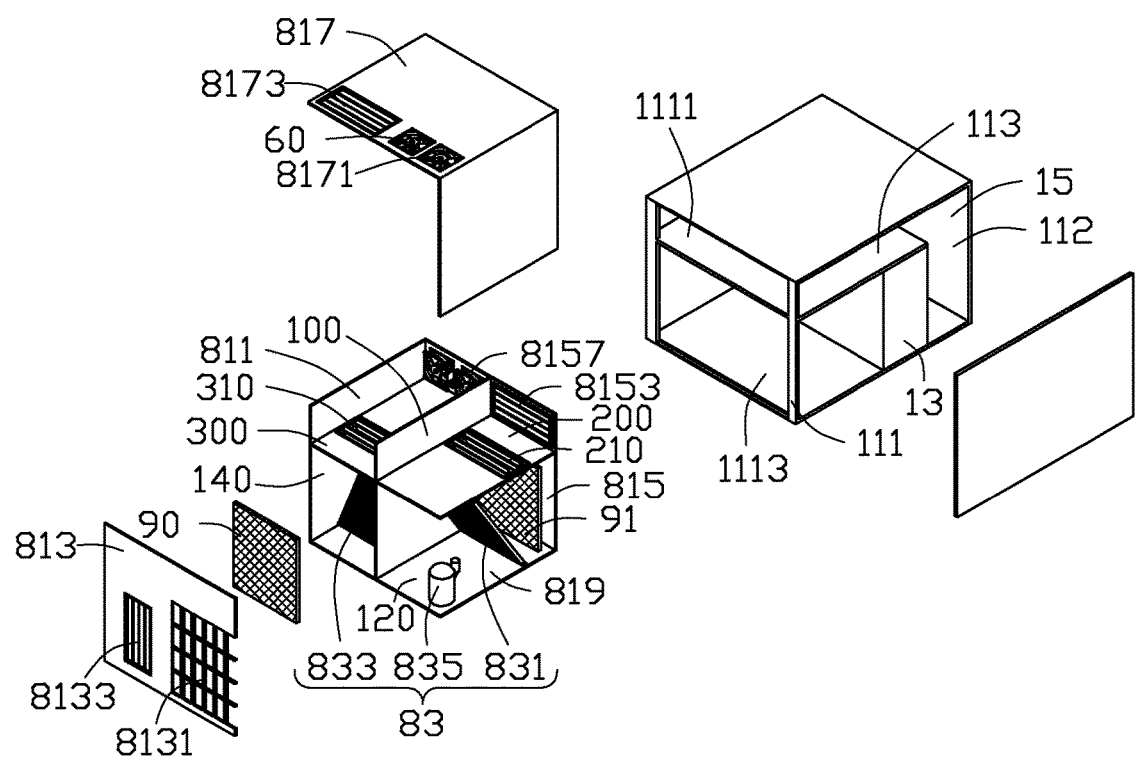
FIG. 6 is an exploded, isometric view of the heat dissipating system for a data center of FIG. 5.

FIG. 6 illustrates that the data center 10 comprises an enclosure 11 and an electronic device 13 mounted in the enclosure 11. The enclosure 11 comprises a front plate 111, a rear plate 112 and a separating member 113 vertically extending in from a middle portion of the front plate 111. The front plate 111 defines a first air vent 1111 above the separating member 113, and the front plate 111 defines a second air vent 1113 under the separating member 113. An extreme of the separating member 113 and the rear plate 112 cooperatively define a channel 15. The electronic device 13 is located under the separating member 113.

The air processing unit 80 comprises a case 81 (shown in FIG. 5) and an air processing device 83 mounted in the case 81.

Figure 7:
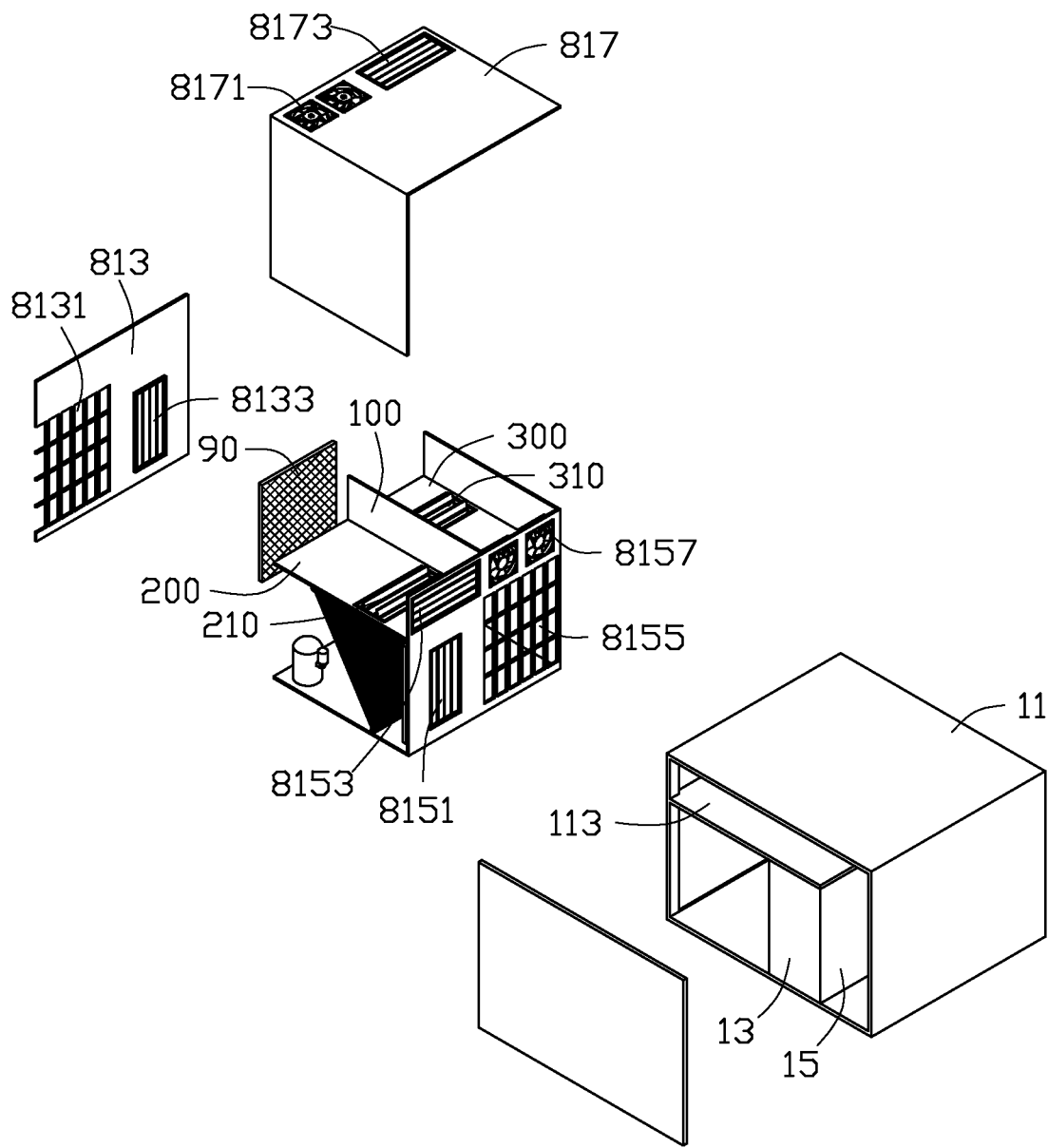
FIG. 7 is an exploded, isometric view of the heat dissipating system of FIG. 6 viewed from a different angle.

FIG. 7 illustrates the heat dissipating system for a data center. The case 81 comprises two opposite side walls 811, a front wall 813 coupled between front ends of the two side walls 811, a rear wall 815 coupled between rear ends of the two side walls 811, a top wall 817 coupled between top ends of the two side walls 811, and a bottom wall 819 coupled between bottom ends of the two side walls 811. A first separating plate 100 is coupled between the top wall 817 and the bottom wall 819, and the first separating plate 100 is parallel to the side wall 811. The case 81 is divided into a first chamber 120 and a second chamber 140 by the first separating plate 100. A second separating plate 200 is mounted in an upper portion of the first chamber 120. The second separating plate 200 is coupled between the first separating plate 100 and the side wall 811, and the second separating plate 200 is parallel to the top wall 817. A third separating plate 300 mounted in an upper portion of the second chamber 140 is coupled between the first separating plate 100 and the side wall 811, and the third separating plate 300 is parallel to the top wall 817.

The front wall 813 defines a first air inlet 8131 opposite to the first chamber 120, and an air inlet damper 8133 is mounted on the front wall 813 opposite to the second chamber 140. A second air inlet damper 8151 is mounted on the rear wall 815 below the second separating plate 200 and opposite to the first chamber 120. An air outlet damper 8153 is mounted on the rear wall 815 above the second separating plate 200 and opposite to the first chamber 120. The rear wall 815 defines a second air inlet 8155 located below the third separating plate 300 and opposite to the second chamber 140. The rear wall 815 defines two first air outlets 8157 located above the third separating plate 300 and opposite to the second chamber 140. The top wall 817 is located at the first chamber 120 and defines two second air outlets 8171. An air outlet damper 8173 is mounted on the top wall 817 and at the second chamber 140. The first air outlets 8157 and the air outlet damper 8153 are opposite to the first air vent 1111 of the data center 10, and the second air inlet 8155 is opposite to the second air vent 1113 of the data center 10. A return air damper 310 is mounted on the second separating plate 200 adjacent to the rear wall 815, and a return air damper 310 is mounted on the third separating plate 300 adjacent to the front wall 813. Fans 60 are mounted on the first air outlet 8157 and the second air outlet 8171. A filter screen 90 is mounted on the air inlet damper 8133, and a filter screen 91 is mounted on the second air inlet damper 8151.

The air processing device 83 comprises a condenser 831, an evaporator 833 coupled to the condenser 831, and a compressor 835 coupled to the condenser 831 and the evaporator 833. The condenser 831 is sloping and forms substantially acute angle to the bottom wall 819. The evaporator 833 is sloping and forms a substantially acute angle to the bottom wall 819. The condenser 831 and the compressor 835 are mounted in the first chamber 120, and the condenser 831 is located between the bottom wall 819 and a middle portion of the second separating plate 200. The evaporator 833 is mounted in the second chamber 140, and located between the bottom wall 819 and a middle portion of the third separating plate 300.

Figure 8:
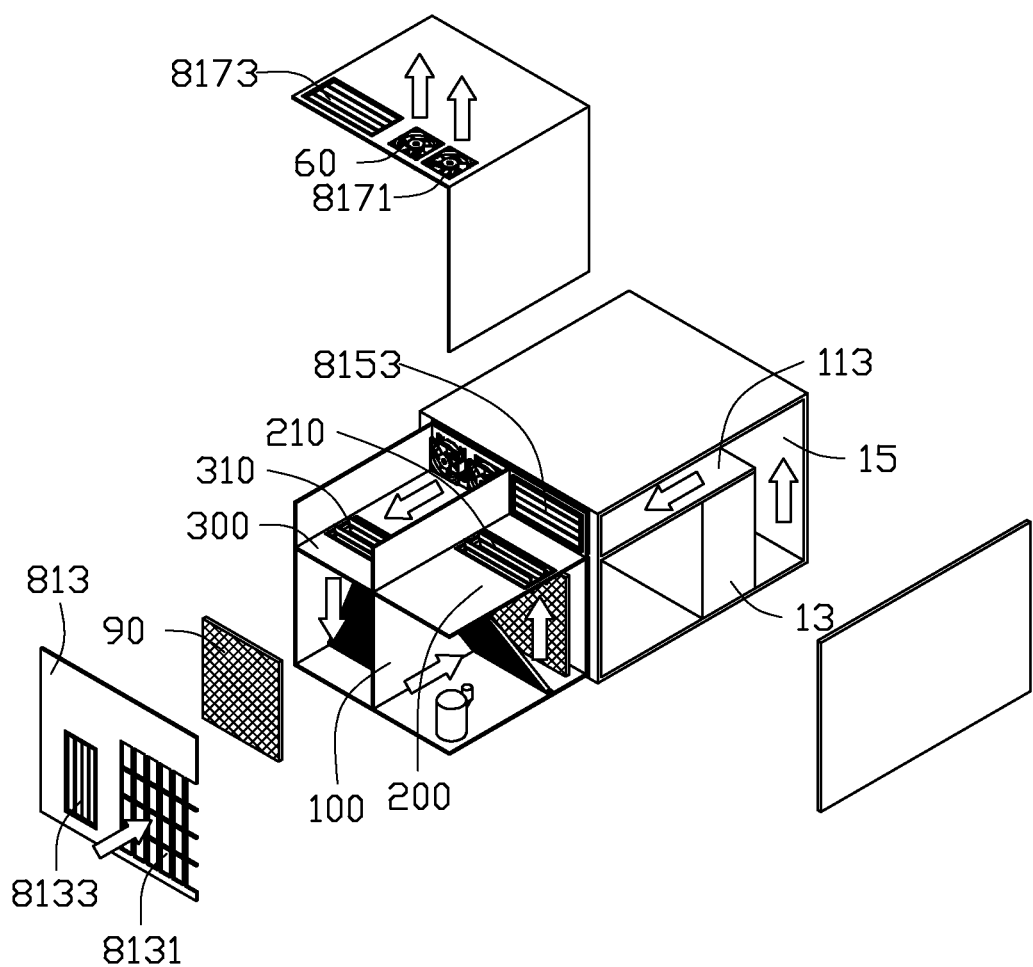
FIG. 8 illustrates a first airflow direction view of the second embodiment of a heat dissipating system for a data center.
Figure 9:
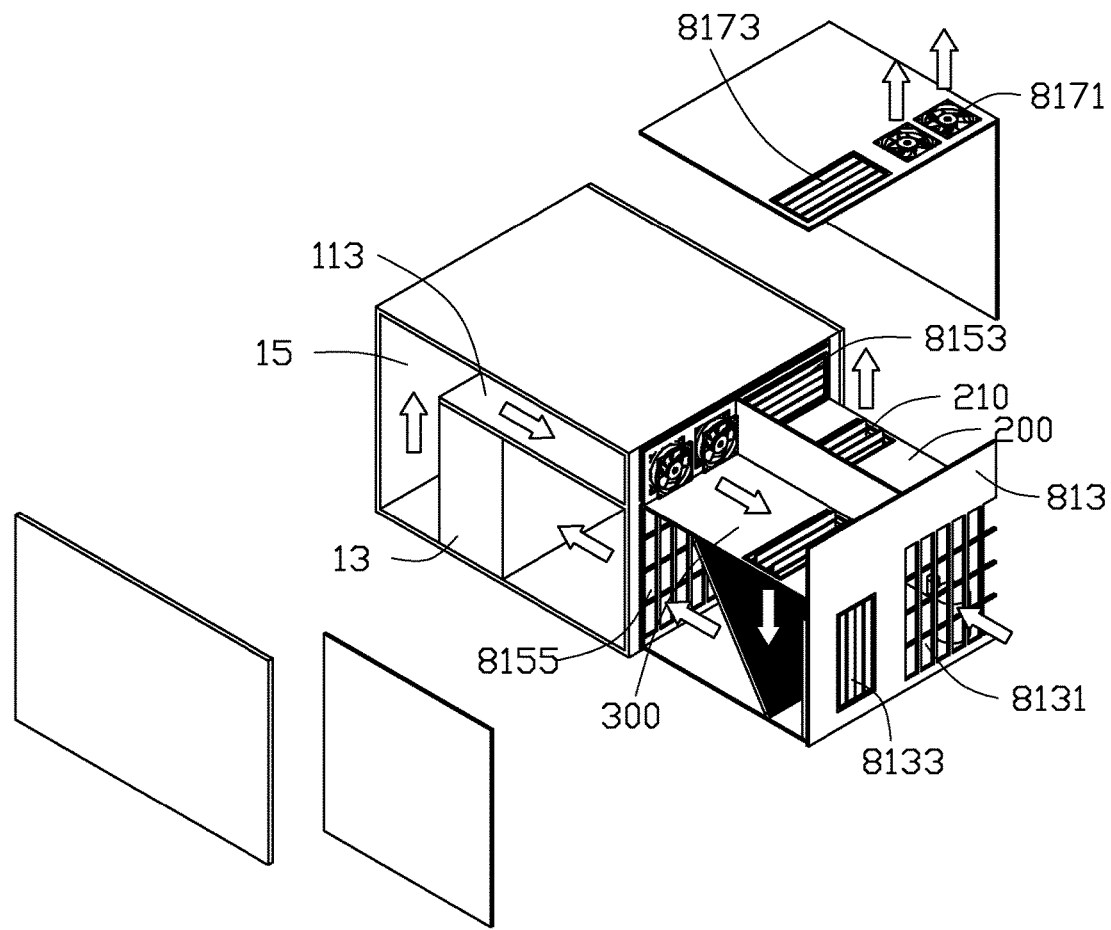
FIG. 9 is a diagrammatic view of the first airflow direction view, but viewed from another aspect of FIG. 8.

FIGS. 8 and 9 illustrate a first wind direction of the second embodiment of a heat dissipating system for a data center. When ambient temperature is too low for dissipating heat from the data center 10 with cold air from outside, the air inlet dampers 8133 and 8151 and the air outlet dampers 8153 and 8173 are closed, and the return air dampers 210, 310 are open. The second chamber 140, the second air inlet 8155, and the second air vent 1113 cooperatively define a first air channel. Air enters into the first chamber 120 through the first air inlet 8131, and the condenser 831 receives hot air output through the return air damper 210, the second air outlet 8171 and the fans 60. Hot air generated by the electronic device 13 enters above the third separating plate 300 of the second chamber 140 successively through the channel 15, above the separating member 113, the first air vent 1111, and the fans 60. The hot air generated by the electronic device 13 enters below the third separating plate 300 of the second chamber 140 and is cooled by the evaporator 833. The cold air enters into the data center 10 through the second air inlet 8155 and the second air vent 1113 and dissipates heat for the electronic device 13.

Figure 10:
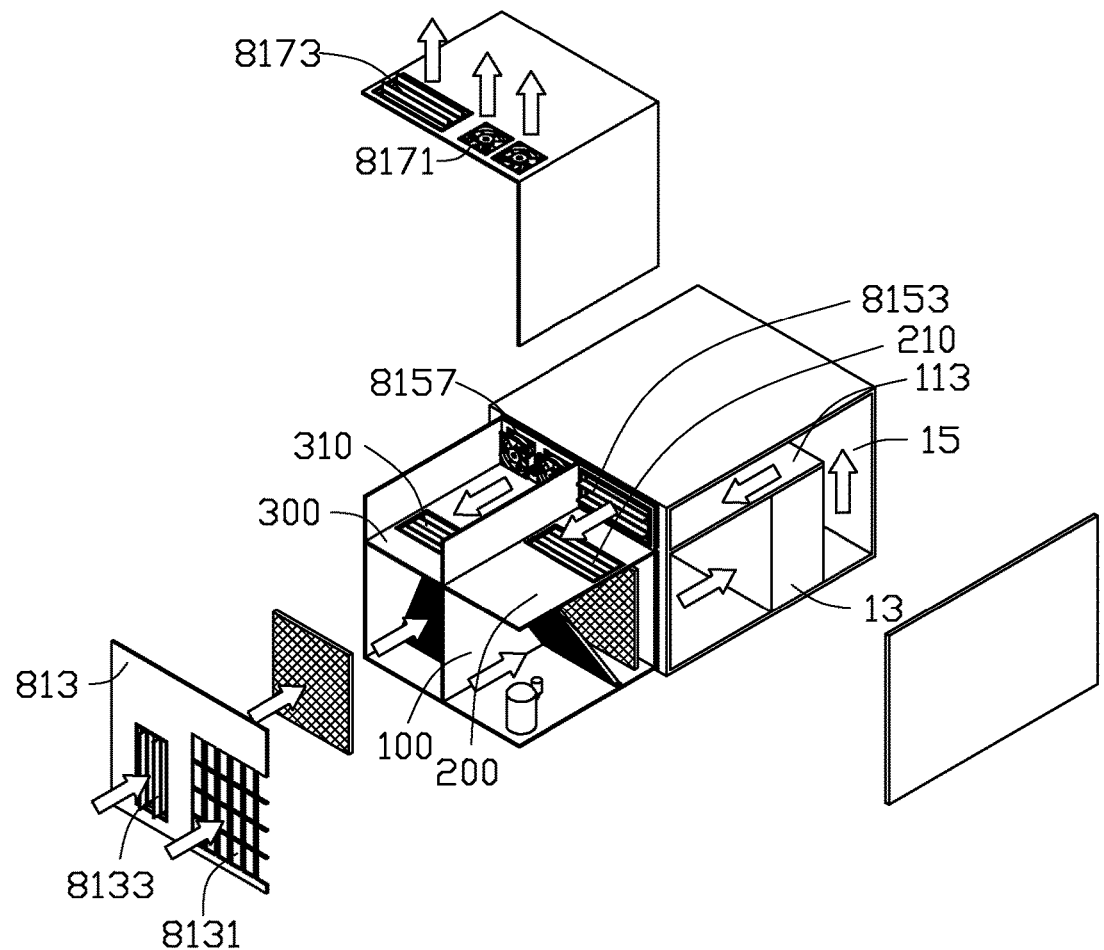
FIG. 10 is a diagrammatic view of a second airflow direction view of the second embodiment of a heat dissipating system for a data center.
Figure 11:
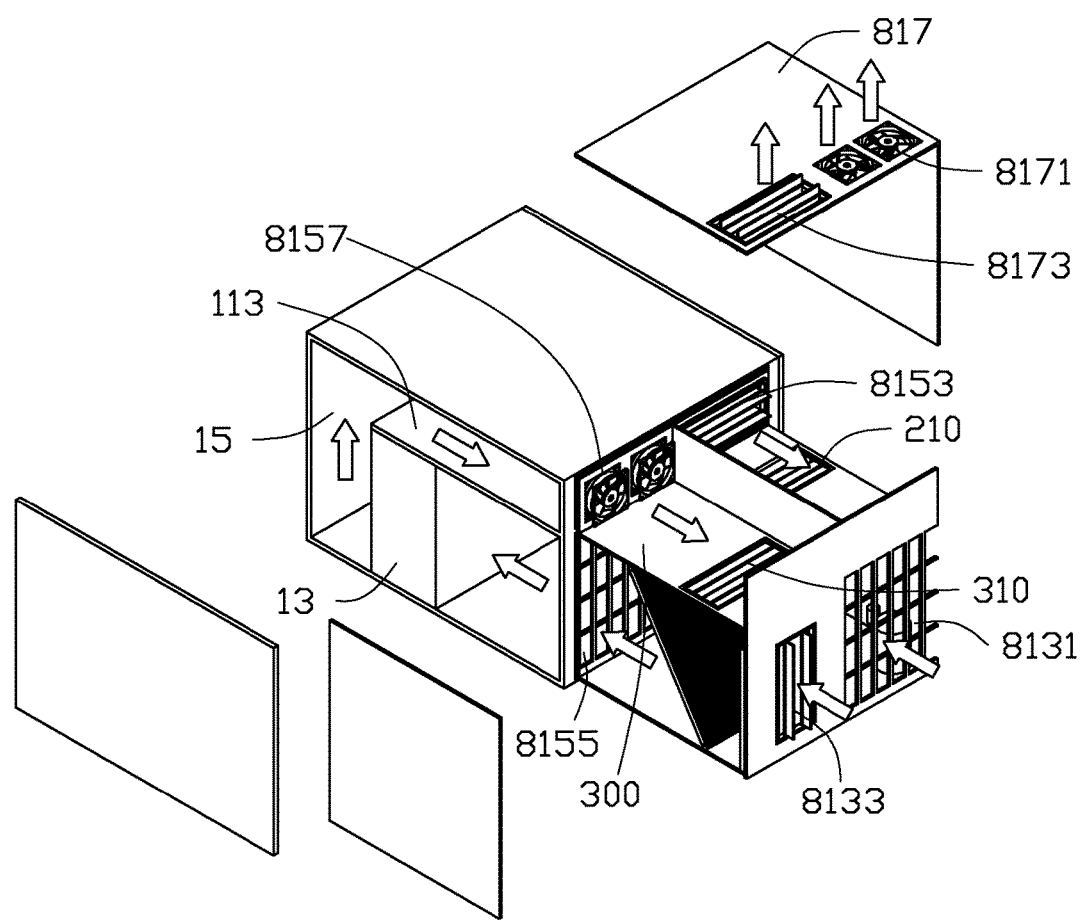
FIG. 11 is a diagrammatic view of the second airflow direction view, but viewed from another aspect of FIG. 10.

FIGS. 10 and 11 illustrate a second wind direction of the second embodiment of a heat dissipating system for a data center. When ambient temperature is suitable to dissipate heat for the data center 10 by inputting cold air from outside, the air inlet dampers 8133 and 8151 and the air outlet dampers 8153 and 8173 are open and the return air dampers 210 and 310 are closed. The air inlet damper 8133, the second air inlet 8155 and the second air vent 1113 cooperatively define a second air channel. Cold air from outside enters into the second chamber 140 through the air inlet dampers 8133, and enters into the data center 10 successively through the filter screen 90, the evaporator 833, the second air inlet 8155 and the second air vent 1113 to dissipate heat from the electronic device 13. Hot air generated by the electronic device 13 enters above the third separating plate 300 of the second chamber 140 successively through the channel 15, above the separating member 113, the first air vent 1111, and the fans 60. The hot air generated by the electronic device 13 is output to the case 81 through the air outlet damper 8173. Air enters into the first chamber 120 through the first air inlet 8131 and is cooled by the condenser 831. The cold air enters into the data center 10 through the filter screen 91, the air inlet damper 8151 and the second air vent 113 to dissipate heat for the electronic device 13. Hot air generated by the electronic device 13 enters above the second separating plate 200 of the first chamber 120 through the channel 15, above the separating member 113, the first air vent 1111 and the air outlet damper 8153; and is output from the second air outlet 8171 and the fans 60.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A heat dissipating system comprising:
a data center defining a first air vent and a second air vent and comprising an enclosure and an electronic device mounted in the enclosure; and
an air processing unit comprising:
a case defining a first air inlet, a second air inlet opposite to the second air vent, and a first air outlet opposite to the first air vent, at least one air inlet damper mounted on the case; a first return air damper is mounted in the case; and an air processing device;
wherein the case is divided into a first chamber and a second chamber separated from the first chamber, the first air inlet is defined on the first chamber; and the second air inlet, the first air outlet, the air inlet damper, and the first return air damper are defined on the second chamber;
wherein in event that ambient temperature is not suitable to dissipate heat for the data center by inputting cold air from outside, the air inlet damper is closed and the first return air damper is open, whereby hot air generated by the electronic device enters into the case through the first air vent and the first air outlet and is transmitted to the air processing device through the first return air damper, and cold air cooled by the air processing device enters into the data center through the second air inlet and the second air vent to dissipate heat for the electronic device; and
wherein in event that ambient temperature is suitable to dissipate heat from the data center by inputting cold air from outside, the air inlet damper is open and the first return air damper is closed, whereby cold air from outside enters into the case from the air inlet damper and is transmitted to the data center through the second air inlet and the second air vent to dissipate heat for the electronic device, and hot air generated by the electronic device enters into the case through the first air vent and the first air outlet, and is output from the case.

2. The heat dissipating system of claim 1, wherein the case comprises two opposite side walls, a front wall coupled between front ends of the two side walls, a rear wall coupled between rear ends of the two side walls, a top wall coupled between top ends of the two side walls, and a bottom wall coupled between bottom ends of the two side walls, the first air inlet is defined at the front wall, and the second air inlet and the first air outlet are defined at the rear wall.

3. The heat dissipating system of claim 2, wherein a first separating plate is coupled between the top wall and the bottom wall, and parallel to the front wall, the case is divided into the first chamber and the second chamber by the first separating plate, a second separating plate is mounted in an upper portion of the second chamber, and the second separating plate is coupled between the first separating plate and the rear wall, and parallel to the top wall.

4. The heat dissipating system of claim 3, wherein the top wall located at the first chamber defines two second air outlets, an air outlet damper is mounted on the first separating plate and located above the second separating plate, the first return air damper is mounted on the second separating plate, and the air inlet damper is mounted on the side wall; when ambient temperature is not suitable to dissipate heat for the data center by inputting cold air from outside, the air outlet damper is closed, and when ambient temperature is suitable to dissipate heat for the data center by inputting cold air from outside, the air outlet damper is open.

5. The heat dissipating system of claim 2, wherein a first separating plate is coupled between the top wall and the bottom wall, and parallel to the side wall, the case is divided into the first chamber and the second chamber by the first separating plate; a second separating plate is mounted in an upper portion of the first chamber, the second separating plate is coupled between the first separating plate and the side wall, and parallel to the top wall; a third separating plate is mounted in an upper portion of the second chamber, the third separating plate is coupled between the first separating plate and the side wall, and parallel to the top wall.

6. The heat dissipating system of claim 5, wherein the air inlet damper is mounted on the front wall opposite to the second chamber, the first air inlet is defined at the front wall opposite to the first chamber, the first return air damper is mounted on the third separating plate, the second air inlet is defined at the rear wall, and located below the third separating plate and opposite to the second chamber, and the first air outlet is defined at the rear wall, and located above the third separating plate and opposite to the second chamber.

7. The heat dissipating system of claim 6, wherein an air inlet damper is mounted on the rear wall, and located below the second separating plate and opposite to the first chamber; a first air outlet damper is mounted on the rear wall; and located above the second separating plate and opposite to the first chamber; the top wall located at the first chamber defines two second air outlets; a second air outlet damper is mounted on the top wall and located at the second chamber; a second return air damper is mounted on the second separating plate; when ambient temperature is not suitable to dissipate heat for the data center by inputting cold air from outside, the first air outlet damper and the second air outlet damper are closed, and the second return air damper is open; when ambient temperature is suitable to dissipate heat for the data center by inputting cold air from outside, the first air outlet damper and the second air outlet damper are open, and the second return air damper is closed.

8. The heat dissipating system of claim 5, wherein the air processing device comprises a condenser, an evaporator coupled to the condenser, and a compressor coupled to the condenser and the evaporator, the condenser and the compressor are mounted in the first chamber, the evaporator is mounted in the second chamber, and the condenser and the evaporator are sloping to the bottom wall, when ambient temperature is not suitable to dissipate heat for the data center by inputting cold air from outside, hot air generated by the condenser is output from the case, and hot air generated by the electronic device is cooled by the evaporator, and cold air enters into the data center through the second air inlet and the second air vent to dissipate heat for the electronic device.

9. The heat dissipating system of claim 1, wherein the enclosure comprises a front plate, a rear plate and a separating member horizontally extending in from a middle portion of the front plate, an extreme of the separating member and the rear plate cooperatively define a channel, hot air generated by the electronic device enters into the case through the channel, above the separating member and the first air vent.

10. A heat dissipating system comprising:
a data center defining a first air vent and a second air vent, and comprising an enclosure and an electronic device mounted in the enclosure; and
an air processing unit comprising:
a case defining a first air inlet, a second air inlet opposite to the second air vent, and a first air outlet opposite to the first air vent, wherein at least one air inlet damper is mounted on the case, and a first return air damper is mounted in the case; and
an air processing device;
wherein the case is divided into a first chamber and a second chamber separated from the first chamber, the first air inlet is defined on the first chamber; and the second air inlet, the first air outlet, the at least one air inlet damper, and the first return air damper are defined on the second chamber;
wherein in event that ambient temperature is not suitable to dissipate heat for the data center by inputting cold air from outside, the second air inlet and the second air vent cooperatively define a first air channel, air entering into the heat dissipating system dissipates heat for the electronic device through the first air channel;
wherein in event that ambient temperature is suitable to dissipate heat for the data center by inputting cold air from outside, the air inlet damper, the second air inlet and the second air vent cooperatively define a second air channel, air entering into the heat dissipating system dissipates heat for the electronic device through the second air channel.

11. The heat dissipating system of claim 10, wherein the case comprises two opposite side walls, a front wall coupled between front ends of the two side walls, a rear wall coupled between rear ends of the two side walls, a top wall coupled between top ends of the two side walls, and a bottom wall coupled between bottom ends of the two side walls, the first air inlet is defined at the front wall, and the second air inlet and the first air outlet are defined at the rear wall.

12. The heat dissipating system of claim 11, wherein a first separating plate is coupled between the top wall and the bottom wall, and parallel to the front wall, the case is divided into the first chamber and the second chamber by the first separating plate, a second separating plate is mounted in an upper portion of the second chamber, and the second separating plate is coupled between the first separating plate and the rear wall, and parallel to the top wall.

13. The heat dissipating system of claim 12, wherein the top wall located at the first chamber defines two second air outlets, an air outlet damper is mounted on the first separating plate and located above the second separating plate, the first return air damper is mounted on the second separating plate, and the air inlet damper is mounted on the side wall; when ambient temperature is not suitable to dissipate heat for the data center by inputting cold air from outside, the air outlet damper is closed, and when ambient temperature is suitable to dissipate heat for the data center by inputting cold air from outside, the air outlet damper is open.

14. The heat dissipating system of claim 11, wherein a first separating plate is coupled between the top wall and the bottom wall, and parallel to the side wall, the case is divided into the first chamber and the second chamber by the first separating plate; a second separating plate is mounted in an upper portion of the first chamber, the second separating plate is coupled between the first separating plate and the side wall, and parallel to the top wall; a third separating plate is mounted in an upper portion of the second chamber, the third separating plate is coupled between the first separating plate and the side wall, and parallel to the top wall.

15. The heat dissipating system of claim 14, wherein the air inlet damper is mounted on the front wall opposite to the second chamber, the first air inlet is defined at the front wall opposite to the first chamber, the first return air damper is mounted on the third separating plate, the second air inlet is defined at the rear wall, and located below the third separating plate and opposite to the second chamber, and the first air outlet is defined at the rear wall, and located above the third separating plate and opposite to the second chamber.

16. The heat dissipating system of claim 15, wherein an air inlet damper is mounted on the rear wall, and located below the second separating plate and opposite to the first chamber; a first air outlet damper is mounted on the rear wall; and located above the second separating plate and opposite to the first chamber; the top wall located at the first chamber defines two second air outlets; a second air outlet damper is mounted on the top wall and located at the second chamber; a second return air damper is mounted on the second separating plate; when ambient temperature is not suitable to dissipate heat for the data center by inputting cold air from outside, the first air outlet damper and the second air outlet damper are closed, and the second return air damper is open; when ambient temperature is suitable to dissipate heat for the data center by inputting cold air from outside, the first air outlet damper and the second air outlet damper are open, and the second return air damper is closed.

17. The heat dissipating system of claim 14, wherein the air processing device comprises a condenser, an evaporator coupled to the condenser, and a compressor coupled to the condenser and the evaporator, the condenser and the compressor are mounted in the first chamber, the evaporator is mounted in the second chamber, and the condenser and the evaporator are sloping to the bottom wall, when ambient temperature is not suitable to dissipate heat for the data center by inputting cold air from outside, hot air generated by the condenser is output from the case, and hot air generated by the electronic device is cooled by the evaporator, and cold air enters into the data center through the second air inlet and the second air vent to dissipate heat for the electronic device.

18. The heat dissipating system of claim 10, wherein the enclosure comprises a front plate, a rear plate and a separating member horizontally extending in from a middle portion of the front plate, an extreme of the separating member and the rear plate cooperatively define a channel, hot air generated by the electronic device enters into the case through the channel, above the separating member and the first air vent.

* * * * *